United States Patent
Kusuyama et al.

(10) Patent No.: US 6,819,118 B2
(45) Date of Patent: Nov. 16, 2004

(54) SENSING DEVICE

(75) Inventors: Koichi Kusuyama, Gunma (JP); Masao Tsukada, Gunma (JP)

(73) Assignee: Hitachi Unisia Automotive, Ltd., Kanagawa (JP)

(*) Notice: Subject to any disclaimer, the term of this patent is extended or adjusted under 35 U.S.C. 154(b) by 25 days.

(21) Appl. No.: 10/330,302

(22) Filed: Dec. 30, 2002

(65) Prior Publication Data

US 2003/0136197 A1 Jul. 24, 2003

(30) Foreign Application Priority Data

Jan. 22, 2002 (JP) ........................................ 2002-013207

(51) Int. Cl.$^7$ ............................................. G01R 27/02
(52) U.S. Cl. ........................................ 324/610; 324/609
(58) Field of Search ................................. 324/252, 443, 324/522, 609, 610

(56) References Cited

U.S. PATENT DOCUMENTS 5,440,234 A * 8/1995 Kondo ........................ 324/526
6,422,088 B1 * 7/2002 Oba et al. ...................... 73/754
6,433,554 B1 * 8/2002 Kawate et al. ............... 324/500
6,448,624 B1 * 9/2002 Ishio et al. ................... 257/417
6,646,446 B2 * 11/2003 Maher et al. ................ 324/526

FOREIGN PATENT DOCUMENTS

JP        8-247881       9/1996
JP       2001-201413     7/2001

* cited by examiner

Primary Examiner—Anjan Deb
Assistant Examiner—Walter Benson
(74) Attorney, Agent, or Firm—Sughrue Mion, PLLC

(57) ABSTRACT

A sensing device of the present invention includes a first resistive branch having first and second resistors connected in series, a second resistive branch comprising third and fourth resistors connected in series and arranged in parallel with the first resistive branch to form a bridge circuit, first and second feed wiring arrangements connecting the first and second resistive branches to a power source side, respectively, in parallel to each other, and a ground wiring arrangement connecting the first and second resistive branches to a ground side.

12 Claims, 5 Drawing Sheets

SENSING DEVICE

BACKGROUND OF THE INVENTION

The present invention relates to a sensing device having a bridge circuit.

A sensing device having a bridge circuit is commonly used as a sensor to measure a target condition (such as a pressure, a load, a vibration, a temperature or a flow rate) in response to resistance changes in the bridge circuit.

SUMMARY OF THE INVENTION

The present invention is to provide a sensing device with a bridge circuit, which can detect a target condition stably while monitoring an anomaly in the sensing device, such as a break in circuit wiring, to secure a high degree of reliability.

According to an aspect of the present invention, there is provided a sensing device, comprising: a first resistive branch comprising first and second resistors connected in series; a second resistive branch comprising third and fourth resistors connected in series, the second resistive branch being arranged in parallel with the first resistive branch to form a bridge circuit for measurement of a target condition; a first feed wiring arrangement connecting the first resistive branch to a power source side; a second feed wiring arrangement connecting the second resistive branch to the power source side in parallel to the first feed wiring arrangement; and a ground wiring arrangement connecting the first and second resistive branches to a ground side.

According to another aspect of the present invention, there is provided a sensing device, comprising: a first resistive branch comprising first and second resistors connected in series; a second resistive branch comprising third and fourth resistors connected in series, the second resistive branch being arranged in parallel with the first resistive branch to form a bridge circuit for measurement of a target condition; a first wiring arrangement connecting the first and second resistive branches to a first side, the first side being one of a power source side and a ground side; and a second wiring arrangement connecting the first and second resistive branches to a second side, the second side being the other of the power source side and the ground side, wherein the first wiring arrangement comprises a first wire connecting the first resistive branch to the first side and a second wire connecting the second resistive branch to the first side in parallel to the first wire.

According to still another aspect of the present invention, there is provided a sensing device, comprising: a first resistive branch extending from a first end to a second end and comprising first and second resistors connected in series; a second resistive branch extending from a first end to a second end and comprising third and fourth resistors connected in series, the second resistive branch being arranged in parallel with the first resistive branch to form a bridge circuit; a first feed wiring arrangement comprising a first trace extending from the first end of the first resistive branch to a first feed terminal for connection to a power source side; a second feed wiring arrangement comprising a second trace extending from the first end of the second resistive branch to a second feed terminal for connection to the power source side; a ground wiring arrangement connecting the second ends of the first and second resistive branches to a ground side; and a substrate on which the first and second resistive branches, the first and second traces and the first and second feed terminals are formed, the substrate comprising a portion electrically separating the first and second traces from each other.

The other objects and features of the present invention will also become understood from the following description with reference to accompanying drawings.

DESCRIPTION OF THE EMBODIMENTS

The present invention will be described below in detail with reference to the drawings. In the following description, the present invention is embodied as a semiconductor pressure sensor although it is applicable to various kinds of sensors, such as pressure sensors, load sensors, vibration sensors, temperature sensors and flow sensors.

To aid in understanding the present invention, the configuration of a conventional semiconductor pressure sensor will be firstly explained with reference to Japanese Laid-Open Patent Publication Nos. 8-247881 and 2001-201413.

Figure 5:
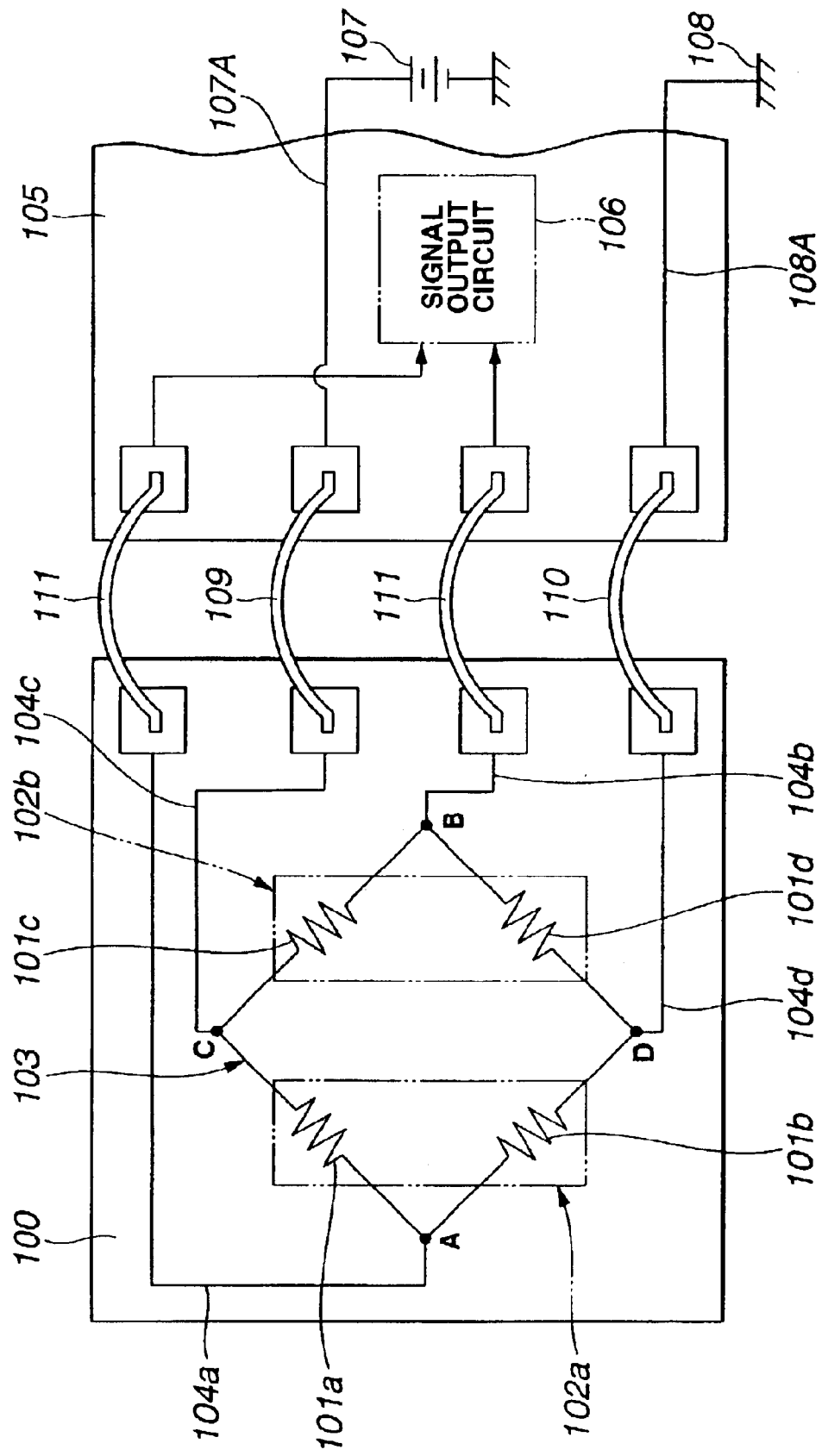
FIG. 5 is a circuit diagram of a conventional semiconductor pressure sensor.

One example of the conventional pressure sensor is shown in FIG. 5. In the pressure sensor, a bridge circuit 103 is provided on a silicon substrate 100. The bridge circuit 103 has four gage resistors 101a, 101b, 101c and 101d. The gage resistors 101a and 101b are connected in series at a junction point A to form a resistive branch 102a, and the gage resistors 101c and 101d are connected in series at a junction point B to form a resistive branch 102b. The resistive branches 102a and 102b are connected in parallel at junction points C and D on the substrate 100. Traces 104a, 104b, 104c and 104d are connected to the junction points A, B, C and D, respectively. Further, a signal output circuit 106 is provided on another substrate 105. A power source line 107A and a ground line 108A are also formed on the substrate 105 for connection to a power source 107A and 108A, respectively. The substrate 105 is disposed adjacently to the substrate 100, and bonding wires including a feed wire 109, a ground wire 110 and detection wires 111 are provided to connect the bridge circuit 103 to the signal output circuit 106, the power source 107 and the ground 108. Accordingly, the bridge circuit 103 is connected at the junction points A and B to the signal output circuit 106 via the traces 104a and 104b and the detection wires 111 so that the signal output circuit 106 measures a voltage difference between the junction points A and B. The bridge circuit 103 is also connected at the junction point C to the power source 107 via the trace 104c, the feed wire 109 and the power source line 107A, and connected at the junction point D to the ground 108 via the trace 104d, the ground wire 110 and the ground line 108A.

When the silicon substrate 100 receives no pressure, the gage resistors 110a, 101b, 101c and 101d of the bridge circuit 103 have substantially the same resistances. Thus, the signal output circuit 106 detects no voltage difference between the junction points A and B and generates a detection signal representative of the no-pressure condition. When the silicon substrate 100 is subjected to pressure, the gage resistors 110a, 101b, 101c and 101d are deflected together with a diaphragm portion of the substrate 100. The resistances of the gage resistors 110a, 101b, 101c and 110d vary by deflection, thereby causing a voltage difference between the junction points A and B. The signal output circuit 106 detects such a voltage difference and generates a detection signal representative of the pressure being applied to the substrate 100.

The pressure sensor generally performs a self-diagnosis function by means of e.g. the signal output circuit 106 for early detection of sensor failures.

In Japanese Laid-open Patent Publication No. 8-247881, for instance, the signal output circuit 106 calculates a sum of the voltages at the junction points A and B, and then, detects an anomaly in the bridge circuit when the calculated sum exceeds a threshold value. However, if the feed wire 109 has been broken due to an external force (such as an impact or a vibration) or wire deterioration, the voltages at the junction points A and B become zero so that the signal output circuit 106 always generates a detection signal representing the no-pressure condition, regardless of the actual pressure being applied to the substrate 100. Such a wire anomaly condition is hard to distinguish from the no-pressure condition. This makes it difficult to detect sensor failures assuredly and to increase sensor reliability.

In Japanese Laid-open Patent Publication No. 2001-201413, the signal output circuit 106 has a memory for storing at least two of the voltages at the junction points A, B, C and D, to detect an anomaly in the sensor based on the stored voltages. However, the installation of such a memory with its necessary wiring causes an increase in parts count, and the configuration of the signal output circuit 106 becomes complicated.

In view of the foregoing, the present invention has been made to provide a sensing device having a bridge circuit that can detect a target condition (such as a pressure, a load, a vibration, a temperature or a flow rate) but also an anomaly in the sensing device assuredly with a simple configuration thereof.

Hereinafter, the configuration and operation of a semiconductor pressure sensor 1 according to one embodiment of the present invention will be explained by way of example only with reference to FIGS. 1 to 4.

Figure 1:
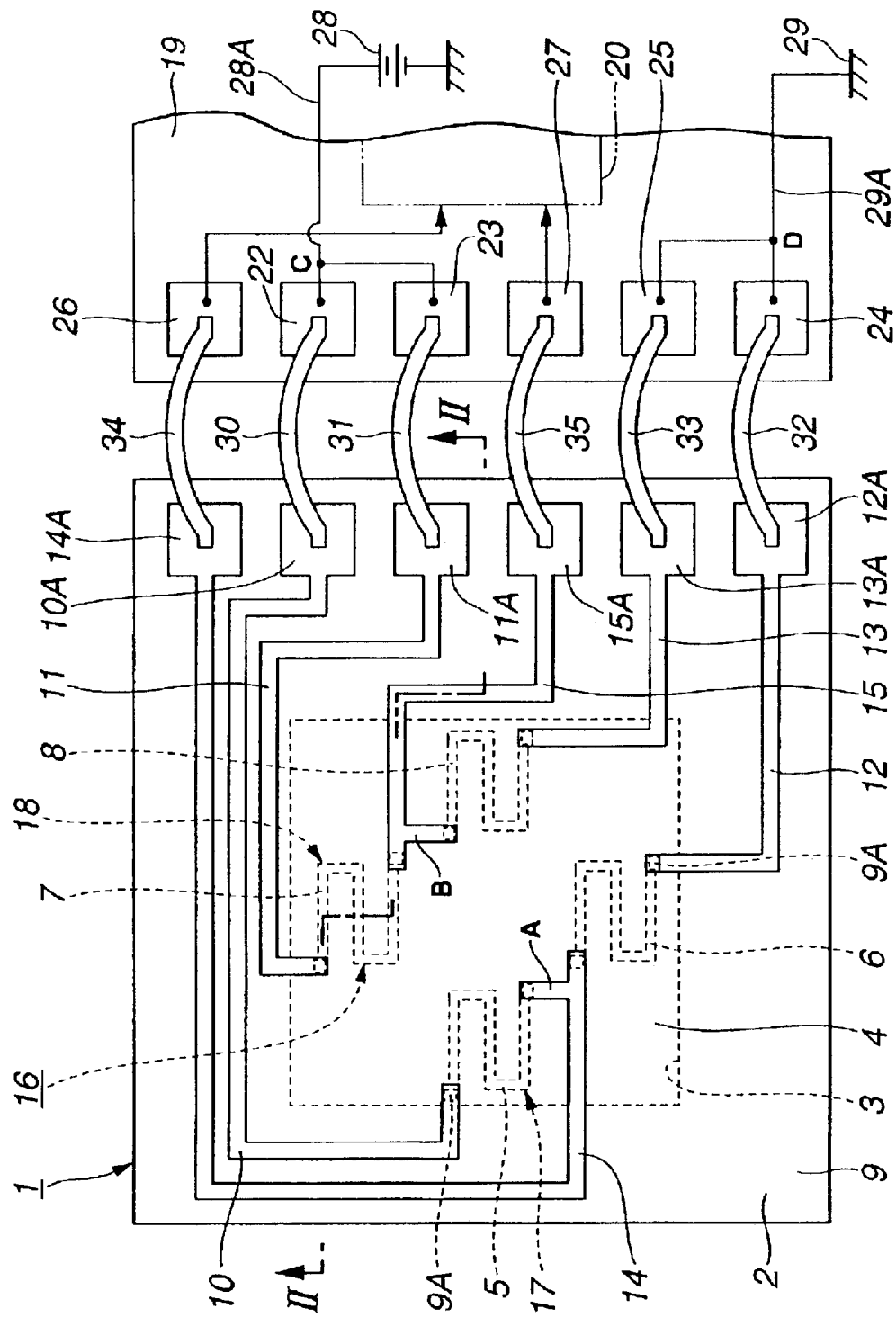
FIG. 1 is a plan view of a semiconductor pressure sensor according to one embodiment of the present invention.
Figure 2:
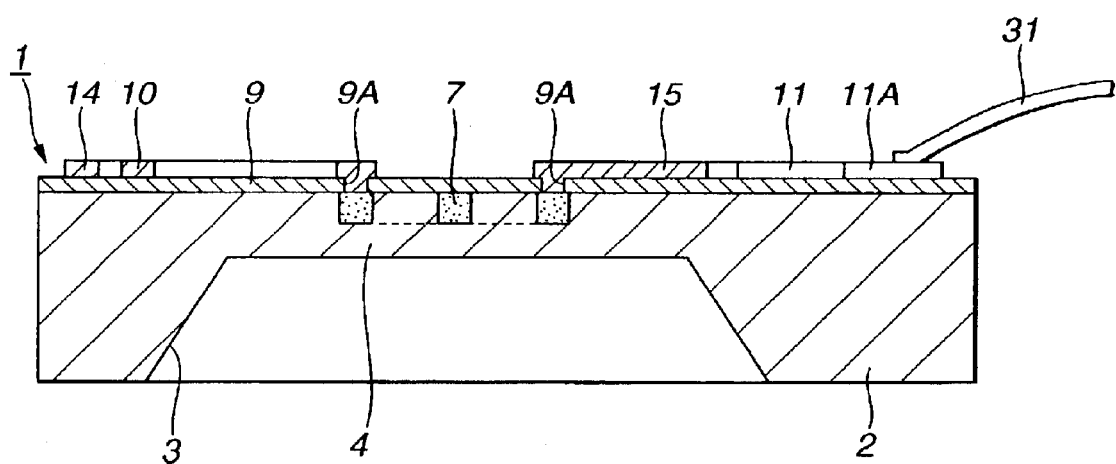
FIG. 2 is a cross-sectional view of the pressure sensor, when taken along a line II—II of FIG. 1.
Figure 3:
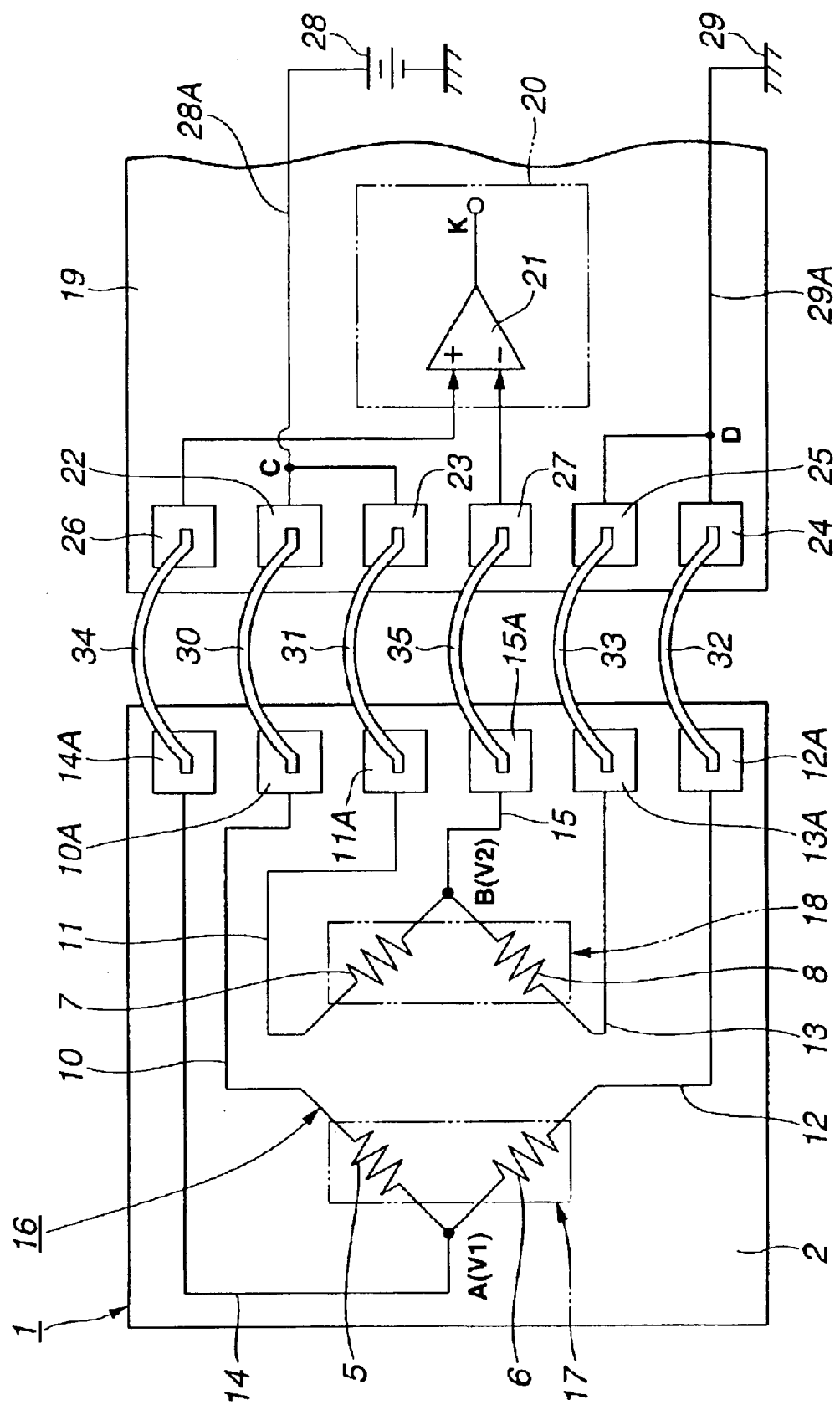
FIG. 3 is a circuit diagram of the pressure sensor.

As shown in FIGS. 1 to 3, the pressure sensor 1 comprises a substrate 2, a bridge circuit 16 provided on the substrate 2, a substrate 19, and a signal output circuit 20 provided on the substrate 19.

The substrate 2 is made of silicon and shaped into a rectangular plate. A recess 3 is formed in one side (i.e. a lower side as viewed in FIG. 2) of the substrate 2 by e.g. anisotropic etching, thereby defining a rectangular diaphragm portion 4 at around the center of the substrate 2. The diaphragm portion 4 is made thinner than a circumferential portion of the substrate 2 so as to be deflected under external pressure.

The bridge circuit 16 has detection resistors 5 to 8. In the present embodiment, the detection resistors 5 to 8 are piezoelectric resistors formed into linear shapes by implanting impurity ions of e.g. boron in the other side (i.e. an upper side as viewed in FIG. 2) of the substrate 2. The detection resistors 5 to 8 are disposed along four sides of the diaphragm portion 4 of the substrate 2. An insulating film 9 of silicon oxide or silicon nitride is provided so as to cover the resistors 5 to 8.

Traces 10, 11, 12, 13, 14 and 15 are provided on the substrate 2 by e.g. forming a metallic film on the insulating film 9 and etching the metallic film. The traces 10 and 11 are electrically separated from each other by a portion of the substrate 2, and the traces 12 and 13 are electrically separated from each other by another portion of the substrate 2.

One end of the trace 14 extends through a through hole 9A of the insulating film 9 so that the resistors 5 and 6 are connected in series at a junction point A via the trace 14 to form a resistive branch 17. Similarly, one end of the trace 15 extends through a through hole 9A of the insulating film 9 so that the resistors 7 and 8 are connected in series at a junction point B via the trace 15 to a resistive branch 18. Then, the resistive branches 17 and 18 are arranged in parallel with each other on the substrate 2. Further, the trace 10 and 11 are electrically connected to high-voltage ends of the resistive branches 17 and 18, respectively, via throughholes 9A of the insulating film 9. The traces 12 and 13 are electrically connected at ends thereof to low-voltage ends of the resistive branches 17 and 18, respectively, via throughholes 9A of the insulating film 9. Further, terminal areas 10A, 11A, 12A, 13A, 14A and 15A are formed at the other ends of the traces 10, 11, 12, 13, 14 and 15, respectively.

The resistances of the resistors 5 to 8 are preset by means of a reference resistor (not shown) in such a manner that voltages V1 and V2 at the junction points A and B become substantially the same under no-pressure condition. The resistors 5 to 8 are deflected together with the diaphragm portion 4 of the substrate 2 under pressure, and change their resistances in accordance with the amount of deflection (i.e. the intensity of pressure) to cause a small voltage difference V1–V2 between the junction points A and B.

The substrate 19 is disposed adjacently to the substrate 2, and terminal areas 22 to 27 are formed on the substrate 19. A power source line 28A and a ground line 29A are also formed on the substrate 19 for connection to a power source 28 and a ground 29, respectively. The terminal areas 22 and 23 are connected, via a junction point C, to the power source line 28A so that a power supply voltage Vs of about 5V is fed from the power source 28. The terminal areas 24 and 25 are connected, via a junction point D, to the ground line 29A. The terminal areas 26 and 27 are connected to input terminals of the signal output circuit 20.

For connection of the bridge circuit 16 to the signal output circuit 20, the power source 28 and the ground 29, electric wires including feed wires 30 and 31, ground wires 32 and 33 and detection wires 34 and 35 are provided. The wires 30 to 35 can be formed of the same or similar metal wires (such as bonding wires). Each of the feed wires 30 and 31, the ground wires 32 and 33 and the detection wires 34 and 35 has two ends: one end is fixed to the substrate 2, and the other end is fixed to the substrate 19.

More specifically, the feed wire 30 is connected between the terminal areas 10A and 22 to form a feed wiring arrangement with the trace 10, and the feed wire 31 is connected between the terminal areas 11A and 23 to form another feed wiring arrangement with the trace 11. These feed wiring arrangements are arranged in parallel to each other so as to connect the resistive branches 17 and 18 to the power source 28 independently. The ground wire 32 is connected between the terminal areas 12A and 24 to form a ground wiring arrangement with the trace 12, and the ground wire 33 is connected between the terminal areas 13A and 25 to form another ground wiring arrangement with the trace 13. These ground wiring arrangements are arranged in parallel to each other so as to connect the resistive branches 17 and 18 to the ground 29 independently. In other words, the resistive branches 17 and 18 are kept electrically separated from each other on the substrate 2.

The detection wires 34 is connected between the terminal areas 14A and 26 so that the junction point A of the resistive branch 17 is connected to one input terminal of the signal output circuit 20 via the trace 14 and the detection wire 34. The detection wire 35 is connected between the terminal areas 15A and 27 so that the junction point B of the resistive branch 18 is connected to the other input terminal of the signal output circuit 20 via the trace 15 and the detection wire 35. By this, the signal output circuit 20 measures a voltage difference V1–V2 between the junction points A and B.

Figure 4:
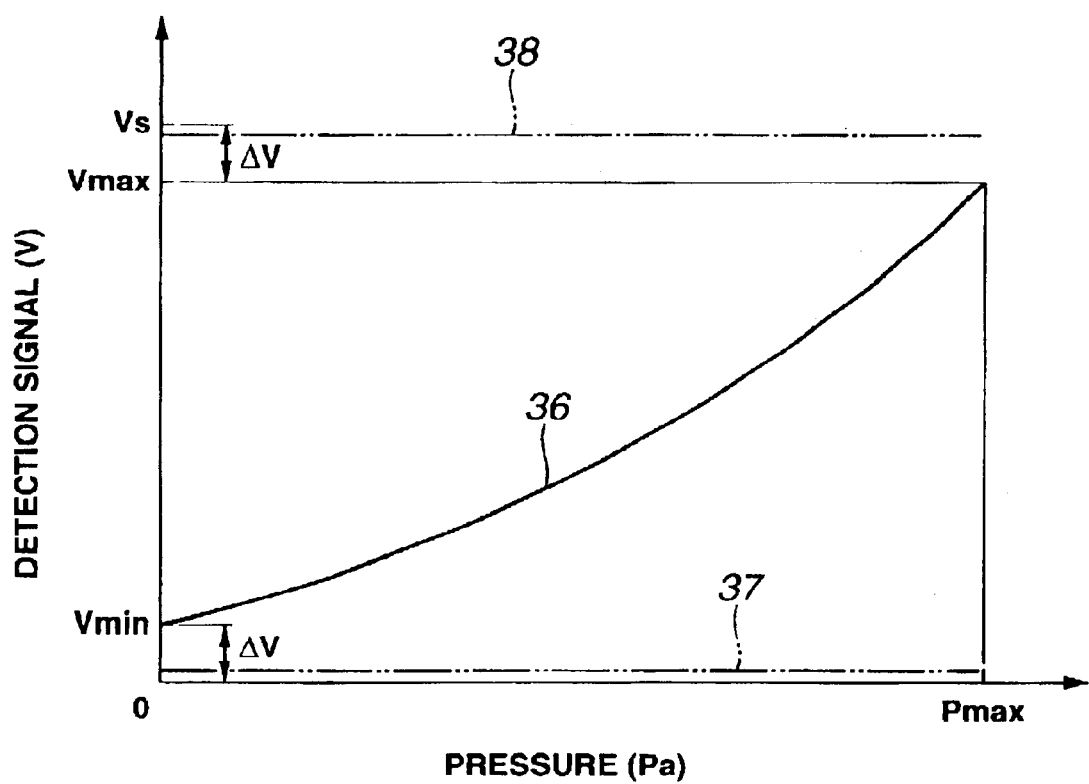
FIG. 4 is a graph showing pressure-signal characteristics of the pressure sensor.

The signal output circuit 20 has a differential amplifier 21 to generate a detection signal K upon signal processing. As shown in FIG. 4, the differential amplifier 21 amplifies the measured voltage difference V1–V2 at a prescribed amplification factor so that the detection signal carries a voltage of 0 V to Vs. This amplification factor is preset in such a manner that the voltage of the detection signal K ranges from a minimum voltage Vmin to a maximum voltage Vmax in accordance with a characteristic curve 36 as the pressure applied on the diaphragm portion 4 of the substrate 2 changes from a minimum detectable pressure Pmin and a maximum detectable pressure Pmax. This normal signal range of the minimum voltage Vmin to the maximum voltage Vmax is set to be offset voltages $\Delta V$ narrower than the voltage range of the ground voltage (=0 V) to the power supply voltage Vs, and the minimum and maximum voltages Vmin and Vmax are determined as indicated by the following expressions (1) and (2).

$$V\text{min} = 0 + \Delta V = \Delta V \tag{1}$$

$$V\text{max} = Vs - \Delta V \tag{2}$$

For example, the minimum voltage Vmin, the maximum voltage Vmax and the offset voltage $\Delta V$ can be controlled to 0.5 V, 4.5 V and 0.5 V, respectively.

In the above configuration, when the diaphragm portion 4 of the substrate 2 receives no pressure, the bridge circuit 16 is kept in equilibrium with substantially the same voltages V1 and V2 at the junction points A and B. Thus, the signal output circuit 20 produces a detection signal K (=Vmin=$\Delta V$) representing such a no-pressure condition according to the characteristic curve 36 of FIG. 4.

When the diaphragm portion 4 of the substrate 2 is subjected to pressure, the resistors 5 and 8 are deflected together with the diaphragm portion 4 to cause a voltage difference V1–V2 between the junction points A and B. Upon detection of the voltage difference V1–V2, the signal output circuit 20 generates a detection signal K ($\leq$Vmax) representing the pressure being received by the diaphragm portion 4 from the differential amplifier 21.

It is now assumed that either one of the wires 30 to 33 is broken.

In a case that the feed wire 30 is broken, the voltage V1 becomes nearly zero while the voltage V2 normally stands at a positive, pressure-dependent value. In other words, the voltage difference V1–V2 between the junction points A and B becomes relatively large. When these voltages V1 and V2 are input to the terminals of the signal output circuit 20 with polarities shown in FIG. 3, the differential amplifier 21 amplifies the voltage difference V1–V2 at the above prescribed amplification factor to generate the detection signal K. In this case, the voltage of the detection signal K falls outside the normal signal range of Vmin to Vmax to be nearly 0 V irrespective of the actual pressure, as indicated by a characteristic curve 37 of FIG. 4.

In a case that the feed wire 31 is broken, the voltage V2 becomes nearly zero while the voltage V1 normally stands at a positive, pressure-dependent value. When these voltages V1 and V2 are input to the terminals of the signal output circuit 20 with polarities shown in FIG. 3, the differential amplifier 21 amplifies the voltage difference V1–V2 at the prescribed amplification factor to generate the detection signal K. In this case, the voltage of the detection signal K falls outside the normal signal range of Vmin to Vmax to be nearly Vs irrespective of the actual pressure, as indicated by a characteristic curve 38 of FIG. 4.

It is therefore possible to detect a break in either of the feed wires 30 and 31 easily and assuredly, without confusing such a wire anomaly condition with the equilibrium condition of the bridge circuit 16, by monitoring the voltages V1 and V2 and judging whether the detection signal K is within the normal signal range of Vmin to Vmax or not.

In a case that the ground wire 32 is broken, the voltage V1 becomes nearly equal to the power supply voltage Vs while the voltage V2 normally stands at a positive, pressure-dependent value. When these voltages V1 and V2 are input to the terminals of the signal output circuit 20 with polarities shown in FIG. 3, the differential amplifier 21 generates the detection signal K that comes close to the voltage Vs outside the normal signal range of Vmin to Vmax.

In a case that the ground wire 33 is broken, the voltage V2 becomes nearly equal to the power supply voltage Vs while the voltage V1 normally stands at a positive, pressure-dependent value. When these voltages V1 and V2 are input to the terminals of the signal output circuit 20 with polarities shown in FIG. 3, the differential amplifier 21 generates the detection signal K that comes close to 0 V outside the normal signal range of Vmin to Vmax.

It is thus also possible to detect a break in either of the ground wires 32 and 33 easily and assuredly, without confusing such a wire anomaly condition with the equilibrium condition of the bridge circuit 16, by monitoring the voltages V1 and V2 and judging whether the detection signal K is within the normal signal range of Vmin to Vmax.

As described above, the pressure sensor 1 has a simple configuration in which the resistive branches 17 and 18 of the bridge circuit 16 can be independently supplied with power and grounded. As a result, the pressure sensor 1 becomes able to measure a target pressure stably while monitoring the continuity of each of the wires 30 to 33 assuredly with its simple configuration. This makes it possible to increase the reliability of the sensor 1, even when these wires 30 to 33 are formed of thin metal wires (such as bonding wires).

Herein, many alternative sensor configurations are possible. For example, a single ground wire can be provided in place of the ground wires 32 and 33 for connection of the resistive branches 17 and 18 to the ground 29 with the proviso that two feed wires 30 and 31 are provided. Alternatively, a single feed wire may be provided in place of the feed wires 30 and 31 for connection of the resistive branches 17 and 18 to the power source 28 with the proviso that two ground wires 32 and 33 are provided. Further, another judgment circuit may be provided detect a break in each of the wires 30 to 33 separately upon receipt of the voltages V1 and V2, though the signal output circuit 20 is configured to compare the detection signal K generated based on the voltages V1 and V2 with the normal signal range of Vmin to Vmax in order to detect breaks in the wires 30 to 33 in the above embodiment.

The entire contents of Japanese Patent Application No. 2002-013207 (filed on Jan. 22, 2002) are herein incorporated by reference.

Although the present invention has been described with reference to specific embodiments of the invention, the invention is not limited to the above-described embodiments. Various modification and variation of the embodiments described above will occur to those skilled in the art in light of the above teaching. The scope of the invention is defined with reference to the following claims.

What is claimed is:

1. A sensing device, comprising:
a first resistive branch comprising first and second resistors connected in series;
a second resistive branch comprising third and fourth resistors connected in series, the second resistive branch being arranged in parallel with the first resistive branch to form a bridge circuit;
a signal output circuit connected with the bridge circuit and configured to generate a detection signal representing the target condition;
a first substrate on which the first and second resistive branches are provided;
a second substrate on which the signal output circuit is provided;
a power source line formed on the second substrate for connection to a power source;
a ground line formed on the second substrate for connection to a ground;
a first feed wiring arrangement connecting the first resistive branch to the power source line;
a second feed wiring arrangement connecting the second resistive branch to the power source line; and
a ground wiring arrangement connecting the first and second resistive branches to the ground line.

2. A sensing device according to claim 1, wherein the ground wiring arrangement comprises:
a first ground wiring arrangement connecting the first resistive branch to the ground side; and
a second ground wiring arrangement connecting the second resistive branch to the ground side in parallel to the first ground wiring arrangement.

3. A sensing device according to claim 1, wherein each of the first and second wiring arrangements and the ground wiring arrangement comprises an electric wire having a first end fixed to the first substrate and a second end fixed to the second substrate.

4. A sensing device according to claim 3, wherein the first and second substrates comprise terminal areas to which the first and second ends of each electric wire are connected, respectively.

5. A sensing device according to claim 1, wherein the first and second resistive branches are kept separated from each other on the first substrate so as to be connected independently to the power source line.

6. A sensing device according to claim 1, wherein the signal output circuit comprises a first input terminal connected to a first junction point between the first and second resistors and a second input terminal connected to a second junction point between the third and fourth resistors, and is configured to measure a voltage difference between the first and second junction points to generate the detection signal.

7. A sensing device according to claim 6, wherein the signal output circuit is configured to generate the detection signal by amplifying the voltage difference between the first and second junction points at a prescribed amplification factor and detect an anomaly in any of the first and second feed wiring arrangements and the ground wiring arrangement when the detection signal falls outside a normal signal range.

8. A sensing device, comprising:
a first resistive branch comprising first and second resistors connected in series;
a second resistive branch comprising third and fourth resistors connected in series, the second resistive branch being arranged in parallel with the first resistive branch to form bridge circuit for measurement of a target condition;
a signal circuit connected with the bridge circuit and configured to generate a detection signal representing the target condition;
a first substrate on which the first and second resistive branches are provided;
a second substrate on which the signal output circuit is provided;
a power source line formed on the second substrate for connection to a power source;
a ground line formed on the second substrate for connection to a ground;
a first wiring arrangement connecting the first and second resistive branches to one of the power source line and the ground line; and
a second wiring arrangement connecting the first and second resistive branches to the other of the power source line and the ground line,
wherein the first wiring arrangement comprises a first wire connecting the first resistive branch to the said one of the power source line and the ground line and a second wire connecting the second resistive branch to the said one of the power source line and the ground line in parallel to the first wire.

9. A sensing device according to claim 8, wherein the first wiring arrangement is a feed wiring arrangement connecting the first and second resistive branches to the power source side, and the second wiring arrangement is a ground wiring arrangement connecting the first and second resistive branches to the ground side.

10. A sensing device according to claim 8, wherein the second wiring arrangement comprises a third wire connecting the first resistive branch to the second side and a fourth wire connecting the second resistive branch to the second side in parallel to the third wire.

11. A sensing device, comprising:
a first resistive branch extending from a first end to a second end and comprising first and second resistors connected in series;
a second resistive branch extending from a first end to a second end an comprising third and fourth resistors connected in series, the second resistive branch being arranged in parallel with the first resistive branch to form a bridge circuit for measurement of a target condition;
a first feed wiring arrangement comprising a first trace extending from the first end of the first resistive branch to a first feed terminal for connection to a power source side;
a second feed wiring arrangement comprising a second trace extending from the first end of the second resistive branch to a second feed terminal for connection to the power source side;
a ground wiring arrangement connecting the second ends of the first an second resistive branches to a ground side;
a first substrate on which the first and second resistive branches, the first and second traces and the first and second feed terminals are formed, the substrate comprising a portion electrically separating the first and second traces from each other, a signal output circuit connected with the bridge circuit and configured to generate a detection signal representing the target condition;

a second substrate disposed adjacently to the first substrate and on which the signal output circuit is provided;

a power source line formed with terminals on the second substrate for connection to a power source;

a ground line formed with a terminal on the second substrate for connection to a ground;

the first feed wiring arrangement comprising a first wire connecting the first feed terminal to one of the terminals of the power source line;

the second feed wiring arrangement comprising a second wire connecting the second feed terminal to the other of the terminals of the power source line; and the ground wiring arrangement connecting the second ends of the first and second resistive branches to the terminals of the ground line.

12. A sensing device according to claim 11, wherein the ground wiring arrangement comprises a third trace extending on the substrate from the second end of the first resistive branch to a first ground terminal and a fourth trace extending on the substrate from the second end of the second resistive branch to a second ground terminal, and the substrate comprises a portion electrically separating the third and fourth traces from each other.

* * * * *